(12) United States Patent
Choi

(10) Patent No.: US 6,181,178 B1
(45) Date of Patent: Jan. 30, 2001

(54) SYSTEMS AND METHODS FOR CORRECTING DUTY CYCLE DEVIATIONS IN CLOCK AND DATA SIGNALS

(75) Inventor: Jung-hwan Choi, Kyungki-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/358,068

(22) Filed: Jul. 21, 1999

(30) Foreign Application Priority Data

Jul. 21, 1998 (KR) .................................... 98-29291

(51) Int. Cl.[7] .................................................. H03K 3/017
(52) U.S. Cl. ......................... 327/175; 327/158; 375/375
(58) Field of Search .................................... 327/164, 165,
327/172, 175, 237, 248, 249, 250, 291,
77, 161, 162, 163; 326/93, 96; 375/355,
362, 364, 375, 376; 395/200.03, 551, 881

(56) References Cited

U.S. PATENT DOCUMENTS

| 4,527,075 | 7/1985 | Zbinden | 327/175 |
|---|---|---|---|
| 5,491,440 | 2/1996 | Uehara et al. | 327/172 |
| 5,572,158 | 11/1996 | Lee et al. | 327/175 |
| 5,614,855 | 3/1997 | Lee et al. | 327/158 |
| 5,757,218 | 5/1998 | Blum | 327/175 |
| 5,907,254 | * 5/1999 | Chang | 327/175 |

\* cited by examiner

*Primary Examiner*—Kenneth B. Wells
(74) *Attorney, Agent, or Firm*—Myers Bigel Sibley & Sajovec

(57) ABSTRACT

A duty cycle-corrected clock signal is generated from a clock signal. A reference signal also is generated that is based upon a duty cycle deviation between the duty cycle-corrected clock signal and the clock signal. Input data is compared to the reference signal in response to the duty cycle-corrected clock signal, to thereby generate duty cycle-corrected output data. Thus, the clock signal and the input data are both duty cycle-corrected to thereby allow an increase in the operating margins of the integrated circuit. The performance and/or speed of the integrated circuit thereby may be increased.

30 Claims, 9 Drawing Sheets

SYSTEMS AND METHODS FOR CORRECTING DUTY CYCLE DEVIATIONS IN CLOCK AND DATA SIGNALS

FIELD OF THE INVENTION

This invention relates to clocking systems and methods for integrated circuits and more particularly to duty cycle correction systems and methods for clock signals.

BACKGROUND OF THE INVENTION

As the operating speed of integrated circuit devices continues to increase, it may become increasingly important to provide duty cycle correction for clock sources. In particular, when a clock signal is received from internal or external of the integrated circuit and has a duty cycle that is different from 50%, it may become important to correct the duty cycle to 50%. Duty cycle correction systems and methods for clock signals are described in U.S. Pat. Nos. 4,527,075 to Zbinden, entitled Clock Source with Automatic Duty Cycle correction; 5,491,440 to Uehara et al., entitled Automatic Clock Duty Cycle Adjusting Circuit; 5,572,158 to Lee et al., entitled Amplifier with Active Duty Cycle correction; and 5,757,218 to Blum, entitled Clock Signal Duty Cycle correction Circuit and Method. Duty cycle correction systems and methods may be applied to integrated circuits including logic, microprocessor and memory integrated circuits and integrated circuits that combine two or more of these or other functions.

One type of memory integrated circuit to which duty cycle correction systems and methods may be applied employs the Rambus technology marketed by Rambus, Inc. of Mountain View, Calif. The Rambus technology is described in U.S. Pat. Nos. 5,473,575 to Farmwald et al.; 5,578,940 to Dillion et al.; 5,606,717 to Farmwald et al. and 5,663,661 to Dillion et al. A device embodying the Rambus technology is an example of a packet type integrated circuit memory device, because each integrated circuit receives data and addresses in packet units in a normal mode of operation. The packet is received by the Rambus device which generates internal control signals, internal data signals and internal address signals to carry out the corresponding operation of the packet. For example, the packet may include data, address and control signals for a write operation.

FIG. 1 is a block diagram of an input receiver for an integrated circuit such as a Rambus memory device. As shown in FIG. 1, an input receiver 101 receives a clock signal PCLK, data DB and a reference voltage Vref. The input receiver 101 converts the voltage level of the data DB and outputs the result as complementary data signals DO and $\overline{DO}$. For a Rambus device, the data DB may have Transistor-Tranisistor logic (TTL) levels and the data output DO, $\overline{DO}$ may have Complementary Metal Oxide Semiconductor (CMOS) logic levels. Thus, the input receiver 101 amplifies the difference between the input data DB and the reference voltage Vref to convert the input data DB from To TTL levels to CMOS levels, and outputs the data DO and $\overline{DO}$ at CMOS levels. The clock signal PCLK preferably is a duty cycle-corrected clock signal.

Notwithstanding the provision of a duty cycle-corrected clock signal, it still may be difficult to operate integrated circuits at high speeds such as several hundred megaHertz. It may be particularly difficult to operate integrated circuits at high speeds when data is processed at both the rising and the falling edges of a clock signal. In particular, as shown in FIG. 2A, when duty cycles of the data DB and the clock signal CLK are both 50%, the sum of the setup time ts and the hold time th of the data DB may equal 50%. Thus, a maximum margin may be allowed for setup time and hold time. However, as shown in FIG. 2B, if the duty cycles of the data DB and the clock signal CLK are within a range of 40%, the duty cycle of the clock signal CLK may be restored to 50% but the data DB is input to the input receiver 101 as is. Thus, the setup ts and the hold time th may decrease compared to FIG. 2A. Conversely, when the duty cycles of the data DB and the clock signal CLK are within an allowable range of 60%, the setup time ts and the hold time th may increase compared to data having a duty cycle of 50%. The above described increases and decreases may reduce the operating margins of the integrated circuit which may thereby impact the speed and/or performance thereof.

SUMMARY OF THE INVENTION

It is therefore an object of the present invention to provide improved systems and methods for correcting duty cycle deviations in integrated circuits.

It is another object of the present invention to provide improved duty cycle correction in integrated circuits that already include clock duty cycle correction.

These and other objects are provided, according to the present invention, by generating a duty cycle-corrected clock signal from a clock signal and by generating a reference signal that is based upon a duty cycle deviation between the duty cycle-corrected clock signal and the clock signal. Input data is compared to the reference signal in response to the duty cycle-corrected clock signal, to thereby generate duty cycle-corrected output data. Thus, the clock signal and the input data are both duty cycle-corrected to thereby allow an increase in the operating margins of the integrated circuit. The performance and/or speed of the integrated circuit thereby may be increased.

In one embodiment, at least one duty cycle control signal is generated based upon a duty cycle deviation between the duty cycle-corrected clock signal and the clock signal. A second reference voltage is generated from a first reference voltage and from the at least one duty cycle control signal. The input data is then compared to the second reference voltage in response to the duty cycle-corrected clock signal, to thereby generate the duty cycle-corrected output data.

In a preferred embodiment, the at least one duty cycle control signal comprises at least two duty cycle control signals that are proportional to the duty cycle deviation between the duty cycle-corrected clock signal and the clock signal. The first reference voltage and the at least two duty cycle control signals are summed in order to generate the second reference voltage. More specifically, a first and a second duty cycle control signal are provided. The second duty cycle control signal is inverted. The first reference voltage, the first duty cycle control signal and the inverted second duty cycle control signal are summed to produce a summed signal. The summed signal is inverted to produce the second reference voltage.

Thus, the second reference voltage preferably is less than the first reference voltage when the duty cycle of the clock signal is less than a predetermined duty cycle, for example a 50% duty cycle, and is greater than the first reference voltage when the duty cycle of the clock signal is greater than the predetermined duty cycle. Alternatively, when first and second duty cycle control signals are provided, the first duty cycle control signal preferably is greater than the second duty cycle control signal when the duty cycle of the clock signal exceeds a predetermined duty cycle such as a 50% duty cycle, and the first duty cycle control signal is less than the second duty cycle control signal when the duty cycle of the clock signal is less than the predetermined duty cycle.

In an integrated circuit implementation, a plurality of pads may be provided. A delay locked loop is provided that is responsive to a clock signal that is received from at least a first one of the plurality of pads, to generate the duty cycle-corrected clock signal from the clock signal and to generate the at least one duty cycle control signal that is based upon the duty cycle deviation between the duty cycle-corrected clock signal and the clock signal. A first reference voltage generator generates the first reference voltage. A second reference voltage generator generates the second reference voltage from the first reference voltage and from the at least one duty cycle control signal. A data receiver compares input data that is received from at least a second one of the plurality of pads to the second reference voltage, in response to the duty cycle-corrected clock signal, to thereby generate the duty cycle-corrected output data. The plurality of pads, the delay locked loop, the first reference voltage generator, the second reference voltage generator and the data receiver all may be included in an integrated circuit substrate such as a Rambus memory integrated circuit substrate. Thus, duty cycle correction systems and methods according to the present invention may correct for duty cycle deviations in a clock signal and in input data to thereby allow improved operating margins. High speed and/or high performance integrated circuits thereby may be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1:
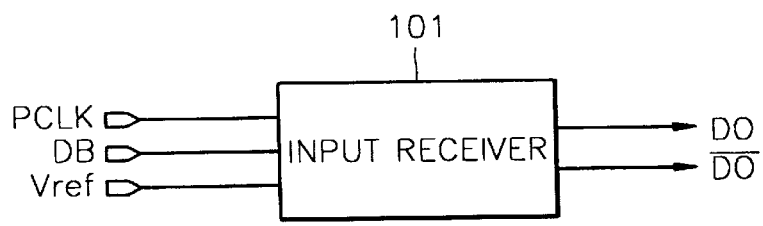
FIG. 1 is a block diagram of an input receiver of an integrated circuit such as a conventional Rambus memory integrated circuit.
Figure 2A:
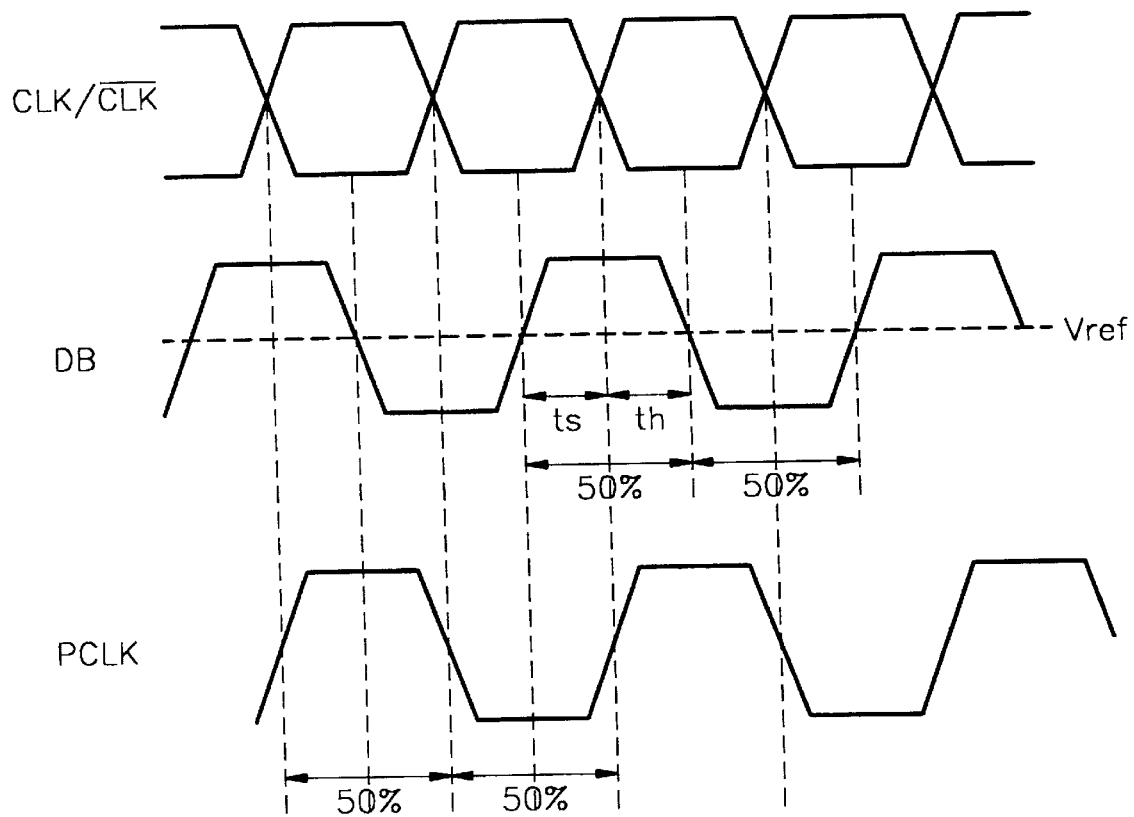
FIGS. 2A and 2B are waveforms illustrating the duty cycles of data that is input to the input receiver of FIG. 1, of 50% and 40% respectively.
Figure 2B:
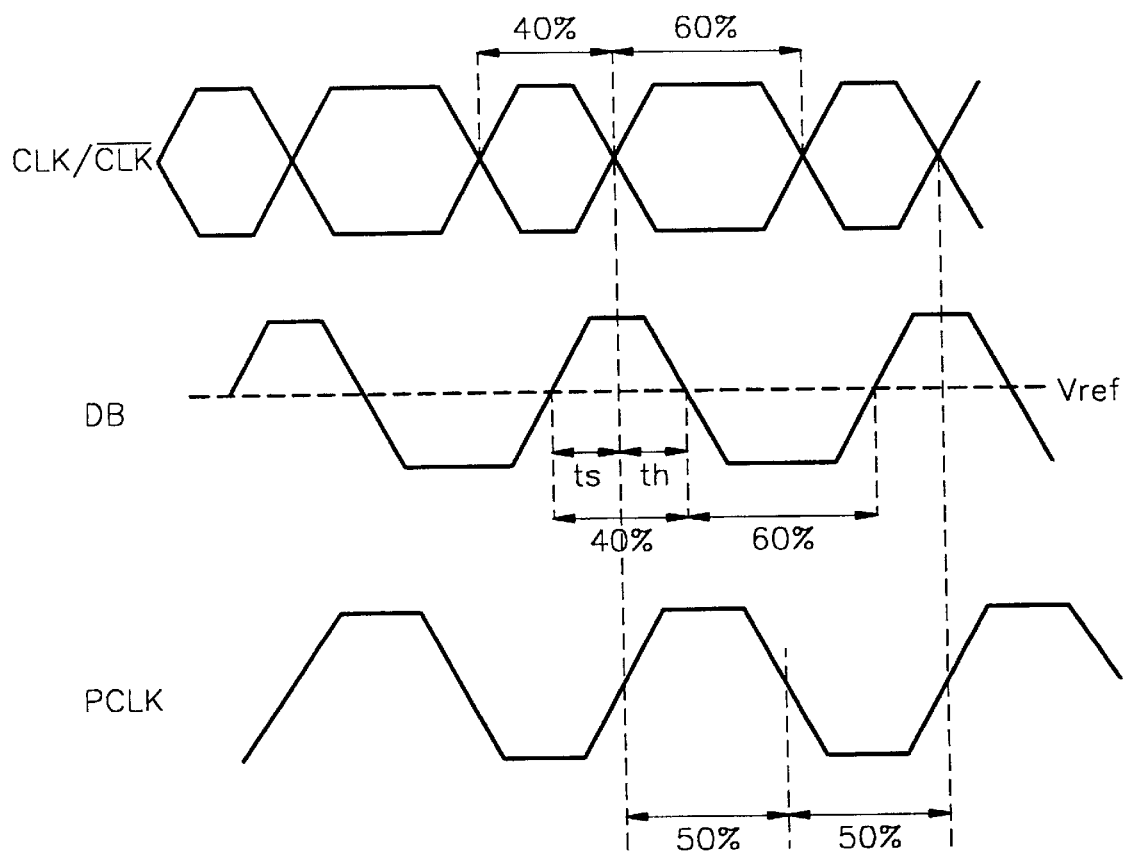
Figure 3:
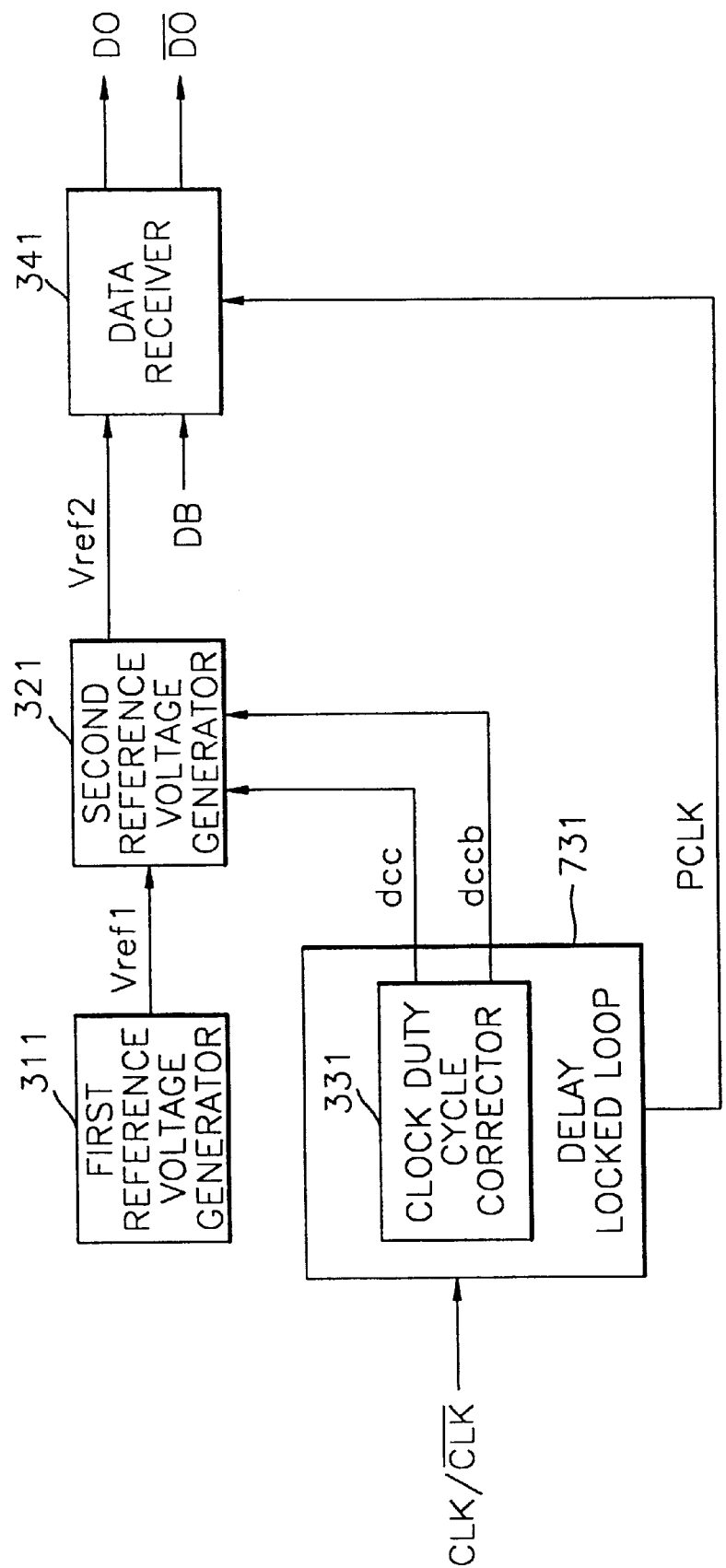
FIG. 3 is a block diagram of duty cycle correction systems and methods according to the present invention.

Referring now to FIG. 3, duty cycle correction systems and methods according to the present invention include a first reference voltage generator 311, a delay locked loop 731 including a clock duty cycle-corrector 331 and a second reference voltage generator 321, that generates signals for a data receiver 341. The second reference voltage generator 321 and the clock duty cycle-corrector 331 can collectively provide means for generating a duty cycle-corrected clock signal from a clock signal, and for generating a reference signal that is based upon a duty cycle deviation between the duty cycle-corrected clock signal and the clock signal.

The first reference voltage generator 311 generates a first reference voltage Vref1 of a predetermined level. For example, the first reference voltage Vref1 may be a direct current (DC) voltage. The first reference voltage generator 311 may be on the same integrated circuit as the other elements of FIG. 3. Alternatively, the first reference voltage may be generated in another integrated circuit or from a power supply voltage, or from discrete circuits and provided to the second reference voltage generator 321.

The clock duty cycle-corrector 331 in the delay locked loop 731 receives an external clock signal CLK and generates at least one duty cycle control signal, preferably a first duty cycle control signal dcc, and a second duty cycle control signal dccb, and also generates a duty cycle-corrected clock signal, also referred to as an internal clock signal, PCLK. The first and second duty cycle control signals dcc and dccb are based on the duty cycle deviation between the duty cycle-corrected clock signal PCLK and the clock signal CLK, and more preferably are proportional to the duty cycle error of the external clock signal CLK, with different ratios. For example, when the duty cycle of the external clock signal CLK is 50%, the first and second duty cycle control signals dcc and dccb each have an identical value. However, when the duty cycle of the external clock signal CLK is greater than 50%, the first duty cycle control signal dcc is greater than the second duty cycle control signal dccb. Conversely, when the duty cycle of the external clock signal CLK is less than 50%, the first duty cycle control signal dcc is less than the second duty cycle control signal dccb. It also will be understood by those having skill in the art that the clock duty cycle-corrector 331 may be provided separate from the delay locked loop 731.

In a specific example, when the duty cycle of the external clock signal CLK is equal to 50%, the first and second duty cycle control signals dcc and dccb are both 1.2V. Also, when the duty cycle of the external clock signal CLK is 60%, the first and second duty cycle control signals dcc and dccb are 1.4V and 1.0V, respectively. Conversely, when the duty cycle of the external clock signal CLK is 40%, the first and second duty cycle control signals are 1.0V and 1.4V, respectively. Thus, the difference between the first duty cycle control signal dcc and the second duty cycle control signal dccb has a negative value when the duty cycle of the external clock signal CLK is less than 50%, and a positive value when the duty cycle of the external clock signal CLK is greater than 50%. The clock duty cycle-corrector 331 corrects the duty cycle of the external clock signal CLK to 50% when the duty cycle of the external clock signal CLK is unstable, thereby outputting the corrected result as the internal clock signal PCLK.

Figure 4A:
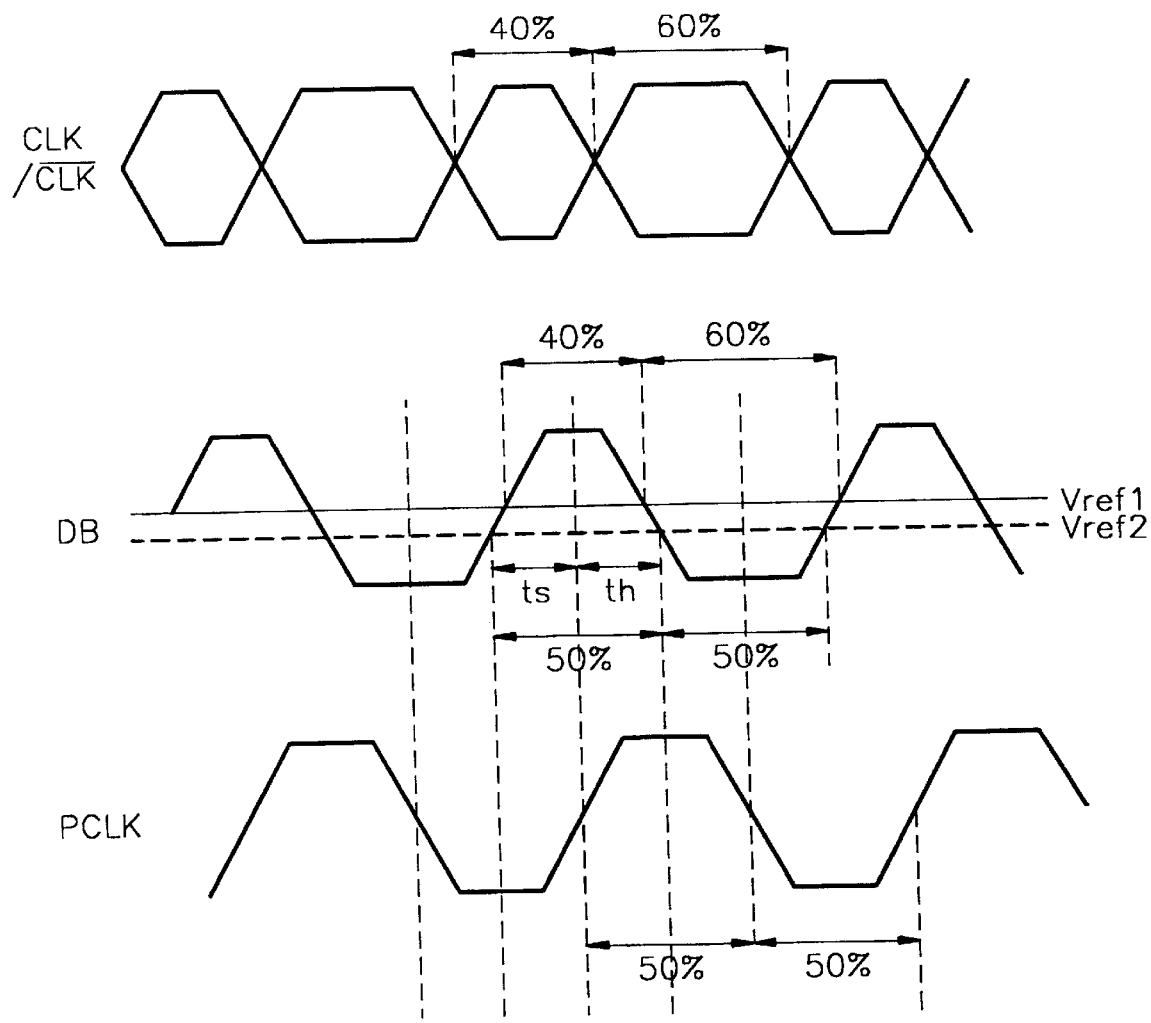
FIGS. 4A and 4B are waveforms illustrating duty cycle-correction of output data to 50% when duty cycles of input data are 40% and 50%, respectively.
Figure 4B:
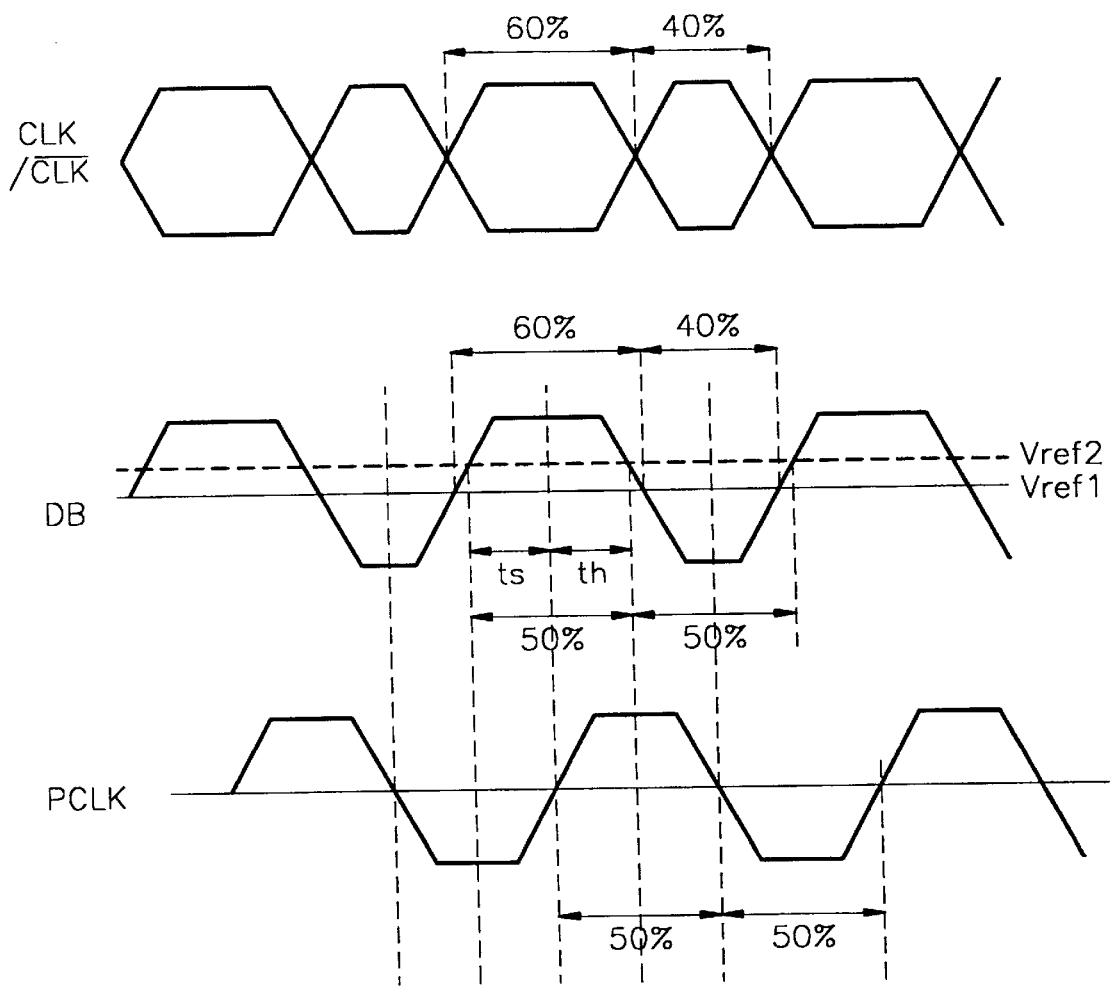

The second reference voltage generator 321 receives the first reference voltage Vref1 and the first and second duty cycle control signals dcc and dccb, and sums and amplifies the received signals to generate a second reference voltage Vref2. As shown in FIG. 4A, the second reference voltage Vref2 is lower than the first reference voltage Vref1 when the duty cycle of the external clock signal CLK is less then 50%, e.g. 40%. Also, as shown in FIG. 4I3, the second reference voltage Vref2 is higher than the first reference voltage Vref1 when the duty cycle of the external clock signal CLK is greater than 50%, e.g. 60%. When the duty cycle of the external clock signal CLK is equal to 50%, the second reference voltage Vref2 is not affected by the duty cycle of the external clock signal CLK. A circuit for the second reference voltage generator 321 will be described in detail with reference to FIG. 5.

Referring again to FIG. 3, the data receiver 341 receives input data DB, the second reference voltage Vref2 and the internal clock signal PCLK. When the duty cycle of the data DB is unstable, i.e., not equal to 50%, the data receiver 341 is synchronized with the internal clock signal PCLK, to compare the data DB and the second reference voltage Vref2. Then, the compared result is amplified, thereby correcting the duty cycle of the data DB to 50% and outputting the duty cycle-corrected data. The data receiver 341 also may convert the voltage level of the input data DB into CMOS voltage levels. The data receiver 341 may operate in synchronization with the rising or falling edge of the internal clock signal PCLK. The data receiver 341 will be described in detail with reference to FIG. 6.

Figure 5:
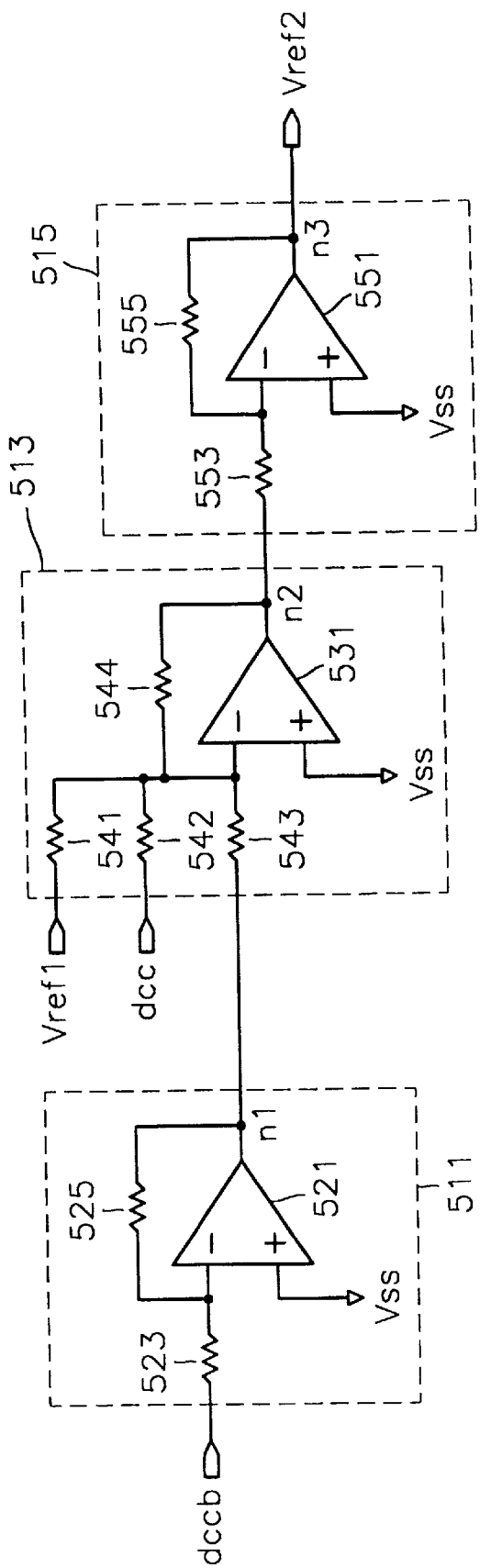
FIG. 5 is a circuit diagram of a second reference voltage generator of FIG. 3.

FIG. 5 is a circuit diagram of a second reference voltage generator 321 of FIG. 3. Referring to FIG. 5, the second reference voltage generator 321 includes first and second buffers 511 and 515 and an operational amplifying portion 513.

The first buffer 511 receives the second duty cycle control signal dccb and inverts the received second duty cycle control signal dccb. The first buffer 511 includes an operational amplifier 521 having an inverting terminal (−) to which the second duty cycle control signal dccb is input and a grounded non-inverting input terminal (+), and resistors 523 and 525. The resistors 523 and 525 have the same resistance value. Thus, a voltage Vn1 that is output from an output node n1 of the first buffer 511 is equal to Equation (1):

$$Vn1 = -dccb \tag{1}$$

The operational amplifying portion 513 includes an operational amplifier 531 and resistors 541, 542, 543 and 544. The first reference voltage Vref1, the first duty cycle control signal dcc and the output voltage Vn1 of the buffer 511 are input to an inverting input terminal (−) of the operational amplifier 531 respectively via the resistors 541, 542 and 543. The non-inverting input terminal (+) of the operational amplifier 531 is grounded. The resistors 541 and 544 have the same resistance while the resistors 542 and 543 have the same resistance. The operational amplifier 531 thus sums the first reference voltage Vref1, the first duty cycle control signal dcc and the output voltage Vn1 of the buffer 511. and amplifies the summed result to produce a summed signal at an output node n2. As a result, the output node n2 of the operational amplifier 513 outputs a voltage Vn2 expressed by Equation (2):

$$Vn2 = -Vref1 - a(dcc - dccb) \tag{2}$$

In Equation (2), "a" is a constant that may depend on the output of the clock duty cycle-corrector 331 and the slope of an edge of the data DB.

The second buffer 515 includes an operational amplifier 551 and resistors 553 and 555. The output voltage Vn2 of the operational amplifying portion 513 is applied to an inverting input terminal (−) of the operational amplifier 551 via the resistor 553. The non-inverting input terminal (+) of the operational amplifier 551 is grounded. The resistors 553 and 555 have the same resistance. The operational amplifier 551 inverts the output voltage Vn2 of the operational amplifying portion 513. As a result, an output voltage Vn3 at an output node n3 of the operational amplifier 551 is expressed by Equation (3)

$$Vn3 = Vref1 + a(dcc - dccb) \tag{3}$$

As described with reference to FIG. 5, a second reference voltage generator 321 according to the present invention changes the amplitude of the second reference voltage Vref2 according to the amplitudes of the first and second duty cycle control signals dcc and dccb. That is, the second reference voltage Vref2 increases when the first duty cycle control signal dcc is higher than the second duty cycle control signal dccb, and decreases when the first duty cycle control signal dcc is lower than the second duty cycle signal dccb. When the first duty cycle control signal dcc is equal to the second duty cycle control signal dccb, the second reference voltage Vref2 is the same as the first reference voltage Vref1.

Figure 6:
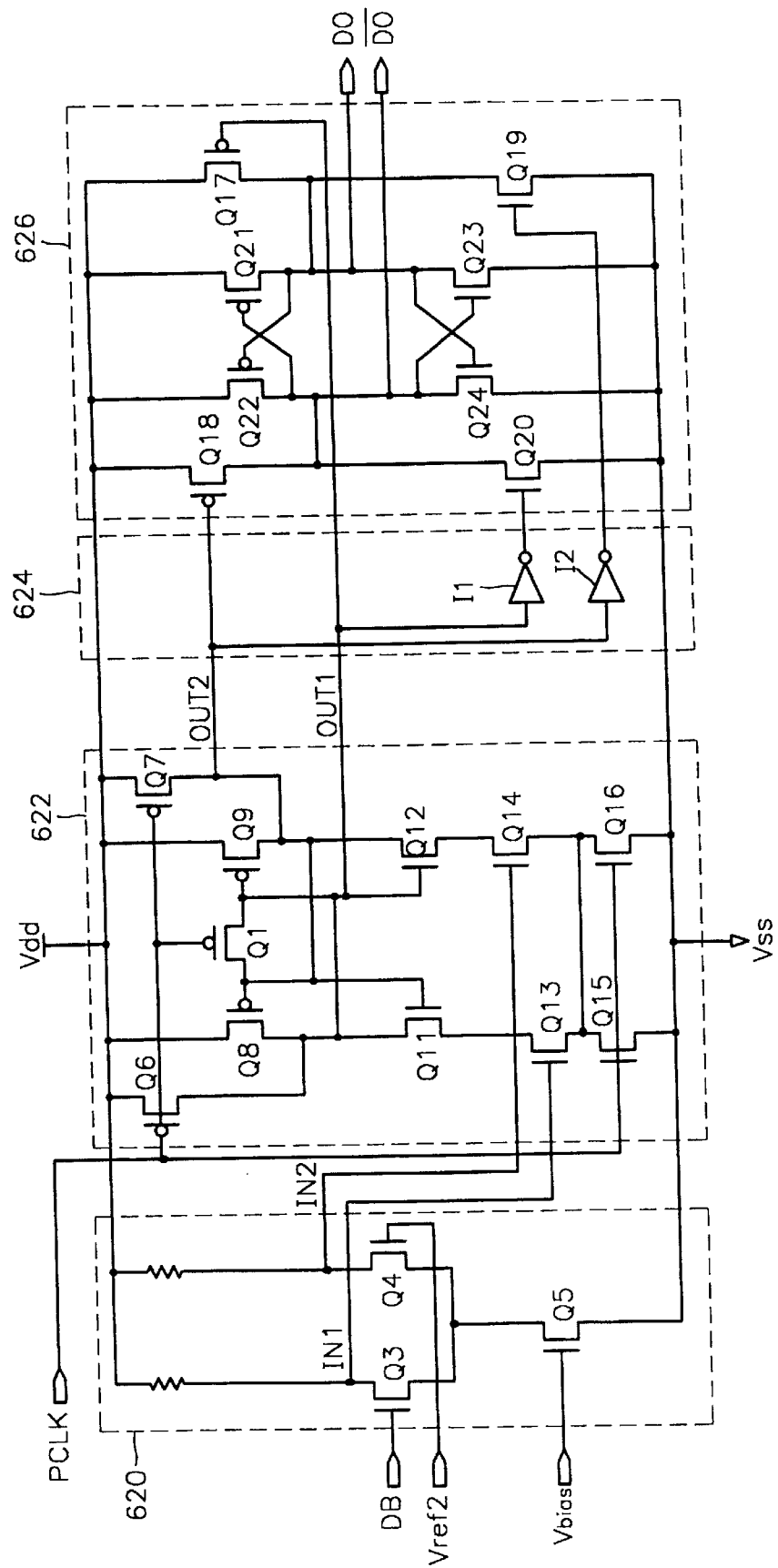
FIG. 6 is a circuit diagram of a data input receiver of FIG. 3.

FIG. 6 is a circuit diagram of a data receiver 341 of FIG. 3. Referring to FIG. 6. the data receiver 341 includes a level shifter 620, a main amplifier 622, a capacitance fixing circuit 624 and a static cell 626.

The level shifter 620 receives the data DB having a small swing, compares the data DB with the second reference voltage Vref2, and produces input signals IN1 and IN2 having a CMOS level. The input signals IN1 and IN2 have complementary values to each other. The level shifter 620 may comprise a conventional differential comparator. A transistor Q5 operates as an active load of the differential comparator, and causes current having a predetermined level to flow through the differential comparator. When the data DB is higher than the second reference voltage Vref2, the current flowing through the transistor Q3 is greater than the current flowing through the transistor Q4. Thus, the input signal IN1 becomes lower than the input signal IN2. Conversely, when the input data DB is lower than the second reference voltage Vref2, the current flowing through the transistor Q3 is less than the current flowing through the transistor Q4. Thus, the input signal IN1 becomes higher than the input signal IN2.

The main amplifier 622 receives the input signals IN1 and IN2 from the level shifter 620 at the rising edge of the internal clock signal PCLK, amplifies the received signals and outputs the amplified signals OUT1 and OUT2. The main amplifier 622 includes a differential amplifier that operates in synchronization with the internal clock signal PCLK. When the internal clock signal PCLK is at a "low" level, transistors Q6 through Q12 all are turned on, to precharge the signals OUT1 and OUT2 to a "high" level. When the internal clock signal PCLK transitions to a "high" level, transistors Q15 and Q16 are turned on. Also, a transistor Q13 or Q14 is turned on according to the voltage level of the input signals IN1 and IN2. Accordingly, the drain voltage of a transistor Q11 or Q12 is pulled down, converting the logic levels of the amplified signals OUT1 and OUT2.

For example, assume that the input signal IN1 is higher than the input signal IN2. Then, the transistor Q13 turns on more rapidly than the transistor Q14, so that the drain voltage of the transistor Q11 is pulled down faster than that of the transistor Q12. Also, the levels of the drain voltages of the transistors Q11 and Q12 are stabilized by the operation of the transistors Q8, Q9 and Q10. The values of the drain voltages of the transistors Q11 and Q12 that are output as the amplified signals OUT1 and OUT2, have "low" and "high" levels, respectively. When the input data DB is at a "high" level, the signals OUT1 and OUT2 have "high" and "low" levels, respectively.

The capacitance fixing circuit 624 stably matches the static cell 626 to an output node of the main amplifier 622. The capacitance fixing circuit 624 includes inverters 11 and 12. The inverter 11 inverts the signal OUT1 and outputs the inverted signal, and the inverter 12 inverts the signal OUT2 and outputs the inverted signal.

The static cell 626 stores the logic states of the signals OUT1 and OUT2 amplified by the main amplifier 622, and outputs the stored signals. The static cell 626 receives the signals OUT1 and OUT2 from the main amplifier 622, stores the received signals, and outputs the stored signals as output data DO and $\overline{DO}$. When the signals OUT1 and OUT2 are precharged to a "high" level, transistors Q17 through Q20 all are turned off. When one of the signals OUT1 and OUT2 transitions to a "low" level after the internal clock signal PCLK transitions to a "high" level, one of the transistors Q17 and Q18, and one of the transistors Q19 and Q20 are turned on, so that the data is stored in a memory cell including transistors Q21 through Q24. The output data DO of the static cell 626 has a logic level that is complementary to the input data DB.

Figure 7:
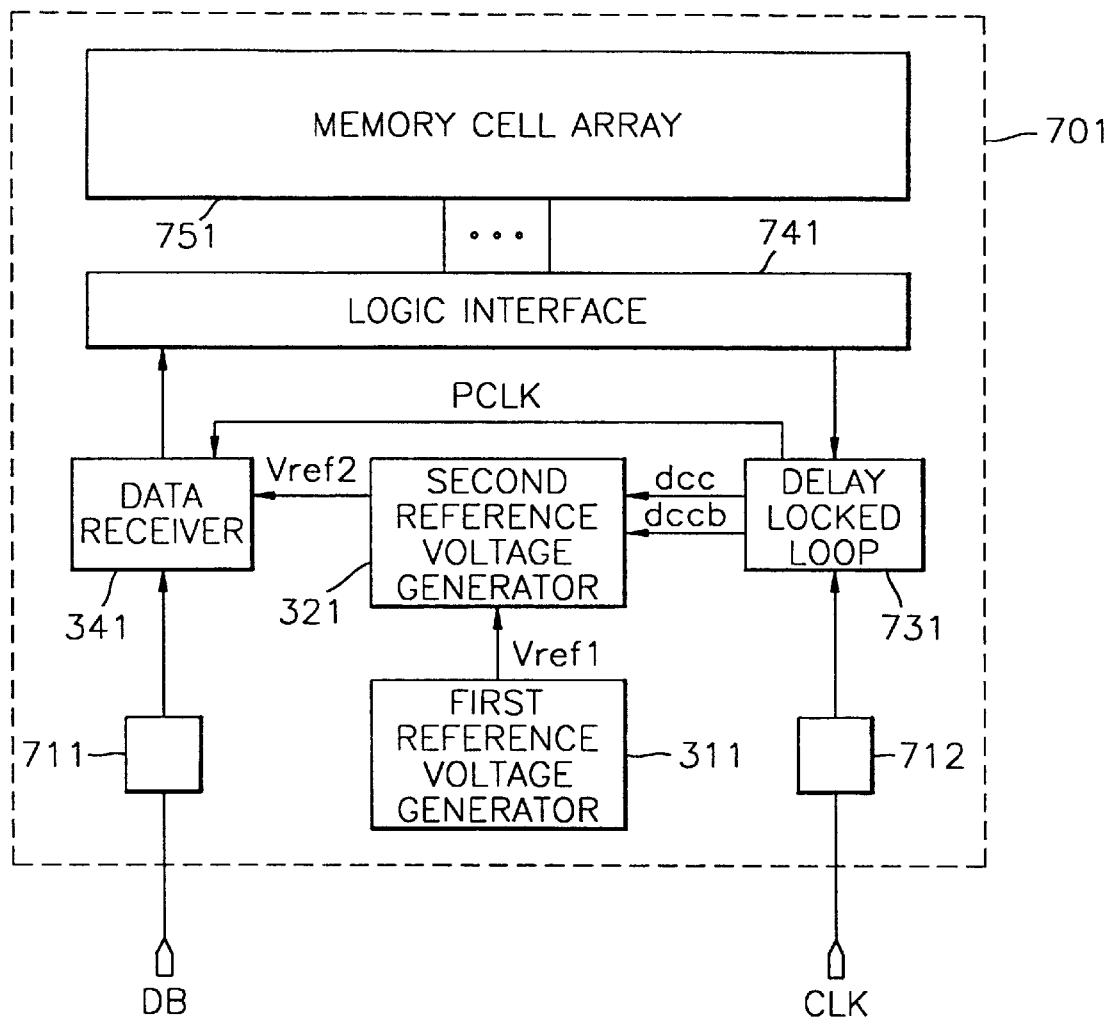
FIG. 7 is a diagram of a Rambus memory device including duty cycle correction of FIG. 3.

FIG. 7 is a block diagram of an integrated circuit memory device such as a Rambus memory device that includes the duty cycle correction circuit shown in FIG. 3. Referring to FIG. 7, the memory device 701 includes a memory cell array 751, a logic interface 741, a data receiver 341, a first pad 711, a second pad 712, and a duty cycle correction circuit having a first reference voltage generator 311, a second reference voltage generator 321 and a clock duty cycle-corrector in a delay locked loop 731.

The delay locked loop 731 receives an external clock signal CLK via the second pad 712 and generates the first and second duty cycle control signals dcc and dccb and the internal clock signal PCLK. The first and second duty cycle control signals dcc and dccb are proportional to a duty cycle error of the external clock signal CLK, with different ratios. The delay locked loop 731 corrects the duty cycle of the external clock signal CLK to 50% when the duty cycle of the external clock signal CLK is longer or shorter than 50%, and outputs the result as the internal clock signal PCLK. When the duty cycle of the external clock signal CLK is 50%, the external clock signal CLK is output as the internal clock signal PCLK. Delay locked loops are well known to those having skill in the art, and are described, for example, in U.S. Pat. No. 5,614,855 to Lee et al., entitled Delay-Locked Loop, the disclosure of which is hereby incorporated herein by reference.

The first reference voltage generator 311 generates a first reference voltage Vref1, for example having a direct current (DC) level, as was already described.

The second reference voltage generator 321 receives the first reference voltage Vref1 and the first and second duty cycle control signals dcc and dccb, and generates a second reference voltage Vref2. As was described above, the second reference voltage Vref2 is obtained by summing the first reference voltage Vref1 and the first and second duty cycle control signals dcc and dccb, and amplifying the result.

The data receiver 341 receives input data DB input from external of the device via the first pad 711, and also receives the internal clock signal PCLK and the second reference voltage Vref2. The data receiver 341 compares the data DB with the second reference signal Vref2 in response to the internal clock signal PCLK, amplifies the compared result, and corrects the duty cycle of the data DB. Thus, as described above, when the duty cycle of the data DB is longer or shorter than 50%, the duty cycle is corrected to 50%. When the duty cycle of the data DB is equal to 50%, the data DB is output as is. The data receiver 341 converts the voltage level of the data DB to a CMOS level. The data receiver 341 may have two input receiving portions connected to the first pad 711: one receiving the data DB at the rising edge of the internal clock signal PCLK and the other receiving the data DB at the falling edge of the internal clock signal PCLK.

The logic interface 741 stores the data input from the input receiver 721 in the memory cell array 751, and interfaces transfer of the data stored in the memory cell array 751 to the delay locked loop 731.

Even though only first and second pads 711 and 712 are shown in the memory device 701 of FIG. 7, a memory device may include a plurality of pads for receiving or outputting data DB, and a plurality of data receivers. The data receiver 341, the first and second reference voltage generators 311 and 321, and the delay locked loop 731 may be used in other memory integrated circuits operating in synchronization with a clock signal as well as in a Rambus memory device. It also may be used in other integrated circuits including logic and/or microprocessor integrated circuits, as was described above.

Thus as described with reference to FIG. 7, a memory device such as a Rambus memory device according to the present invention can correct the duty cycle of the input data DB to 50% when the duty cycle of the input DB is greater or less than 50%, thereby allowing improved operating margins of setup time ts and/or hold time th of the output data.

Figure 8:
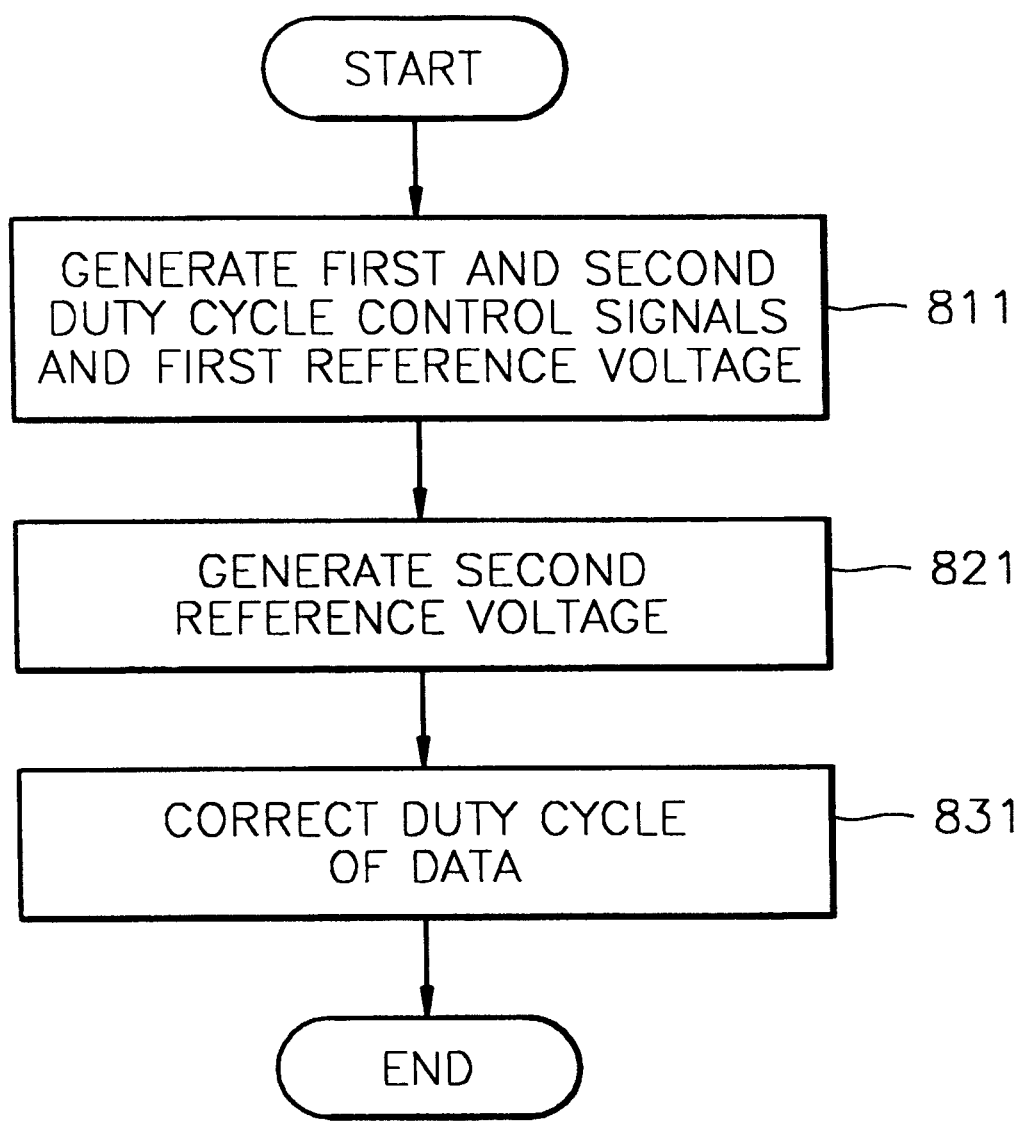
FIG. 8 is a flowchart illustrating correcting duty cycle according to the present invention.

FIG. 8 is a flowchart illustrating operations for correcting the duty cycle of data according to the present invention. The duty cycle correcting illustrated in FIG. 8 will be described in detail with reference to FIGS. 3 through 6.

In Block 811, the first and second duty cycle control signals dcc and dccb which are proportional to a duty cycle error of the external clock signal CLK and different in ratios, and the first reference voltage Vref1, are generated. As already described, the difference between the first and second duty cycle control signals dcc and dccb has a negative value when the duty cycle of the external clock signal CLK is less than 50%, and a positive value when the duty cycle of the external clock signal CLK is greater than 50%.

In Block 821, the first reference voltage Vref1 and the first and second duty cycle control signals dcc and dccb are summed and then amplified, to generate the second reference voltage Vref2. As already described, the second reference voltage Vref2 is lower than the first reference voltage Vref1 when the duty cycle of the external clock signal CLK is less than 50%, and higher than the first reference voltage Vref1 when the duty cycle of the external clock signal CLK is greater than 50%.

In Block 831, the input data DB and the second reference voltage Vref2 are compared with each other, and the compared result is amplified, to output data DO whose duty cycle is corrected to 50%. As a result, the operating margins of the setup time ts and/or the hold time th of the output data DO can be improved. Thus, in duty cycle correction systems and methods according to the present invention, the duty cycle of the input data DB may be corrected to 50% when the duty cycle of the input data DB is greater or less than 50%, so that the operating margins of the setup time ts and/or the hold time th of the output data DO can be improved and preferably maximized.

While the present invention has been illustrated and described with reference to specific embodiments, further modifications and alternations within the spirit and scope of this invention as the defined by the appended claims will occur to those skilled in the art.

What is claimed is:

1. A duty cycle correction system comprising:

means for generating a duty cycle-corrected clock signal from a clock signal, and for generating a reference signal that is based upon a duty cycle deviation between the duty cycle-corrected clock signal and the clock signal; and means for comparing input data to the reference signal, in response to the duty cycle-corrected clock signal, to thereby generate duty cycle-corrected output data.

2. A duty cycle correction system according to claim 1 wherein the means for generating comprises:

means for generating the duty cycle-corrected clock signal from the clock signal, and for generating at least one duty cycle control signal that is based upon the duty cycle deviation between the duty cycle-corrected clock signal and the clock signal; and means for generating a second reference voltage from a first reference voltage and from the at least one duty cycle control signal;

the means for comparing comprising means for comparing the input data to the second reference voltage, in response to the duty cycle-corrected clock signal, to thereby generate the duty cycle-corrected output data.

3. A duty cycle correction system according to claim 2 wherein the at least one duty cycle control signal comprises at least two duty cycle control signals that are proportional to the duty cycle deviation between the duty cycle-corrected clock signal and the clock signal.

4. A duty cycle correction system according to claim 3 wherein the means for generating a second reference voltage comprises means for summing the first reference voltage and the at least two duty cycle control signals.

5. A duty cycle correction system according to claim 4 wherein the at least two duty cycle control signals comprise a first and a second duty cycle control signal, and wherein the means for summing comprises:

means for inverting the second duty cycle control signal;

means for summing the first reference voltage, the first duty cycle control signal and the inverted second duty cycle control signal to produce a summed signal; and means for inverting the summed signal to produce the second reference voltage.

6. A duty cycle correction system according to claim 2 wherein the second reference voltage is less than the first reference voltage when the duty cycle of the clock signal is less than a predetermined duty cycle, and is greater than the first reference voltage when the duty cycle of the clock signal is greater than the predetermined duty cycle.

7. A duty cycle correction system according to claim 3:

wherein the at least two duty cycle control signals comprise a first and a second duty cycle control signal;

wherein the first duty cycle control signal is greater than the second duty cycle control signal when the duty cycle of the clock signal exceeds a predetermined duty cycle; and wherein the first duty cycle control signal is less than the second duty cycle control signal when the duty cycle of the clock signal is less than the predetermined duty cycle.

8. A duty cycle correction system comprising:

a signal generating system that is responsive to a clock signal, to generate a duty cycle-corrected clock signal from the clock signal, and to generate a reference signal that is based upon a duty cycle deviation between the duty cycle-corrected clock signal and the clock signal; and a data receiver that compares input data to the reference signal in response to the duty cycle-corrected clock signal, to thereby generate duty cycle-corrected output data.

9. A duty cycle correction system according to claim 8 wherein the signal generating system comprises:

a clock duty cycle corrector that generates the duty cycle-corrected clock signal from the clock signal, and that generates at least one duty cycle control signal that is based upon the duty cycle deviation between the duty cycle-corrected clock signal and the clock signal; and a second reference voltage generator that generates a second reference voltage from a first reference voltage and from the at least one duty cycle control signal;

the data receiver comparing the input data to the second reference voltage, in response to the duty cycle-corrected clock signal, to thereby generate the duty cycle-corrected output data.

10. A duty cycle correction system according to claim 9 wherein the at least one duty cycle control signal comprises at least two duty cycle control signals that are proportional to the duty cycle deviation between the duty cycle-corrected clock signal and the clock signal.

11. A duty cycle correction system according to claim 10 wherein the second reference voltage generator comprises a summing circuit that sums the first reference voltage and the at least two duty cycle control signals.

12. A duty cycle correction system according to claim 11 wherein the at least two duty cycle control signals comprise a first and a second duty cycle control signal, and wherein the summing circuit comprises:

a first inverter that is responsive to the second duty cycle control signal;

a summer that is responsive to the first reference voltage, the first duty cycle control signal and the first inverter; and a second inverter that is responsive to the summer to produce the second reference voltage.

13. A duty cycle correction system according to claim 9 wherein the second reference voltage is less than the first reference voltage when the duty cycle of the clock signal is less than a predetermined duty cycle, and is greater than the first reference voltage when the duty cycle of the clock signal is greater than the predetermined duty cycle.

14. A duty cycle correction system according to claim 10:

wherein the at least two duty cycle control signals comprise a first and a second duty cycle control signal;

wherein the first duty cycle control signal is greater than the second duty cycle control signal when the duty cycle of the clock signal exceeds a predetermined duty cycle; and wherein the first duty cycle control signal is less than the second duty cycle control signal when the duty cycle of the clock signal is less than the predetermined duty cycle.

15. A duty cycle correction system comprising:

a delay locked loop that is responsive to a clock signal, to generate a duty cycle-corrected clock signal and at least one indication of a duty cycle deviation between the duty cycle-corrected clock signal and the clock signal; and a second reference voltage generator that is responsive to a first reference voltage and to the at least one indication of the duty cycle deviation, to generate a second reference voltage that differs from the first reference voltage by an amount that is related to the duty cycle deviation.

16. A duty cycle correction system according to claim 15 wherein the at least one duty cycle control signal comprises at least two duty cycle control signals that are proportional to the duty cycle deviation between the duty cycle-corrected clock signal and the clock signal.

17. A duty cycle correction system according to claim 16 wherein the second reference voltage generator comprises a summing circuit that sums the first reference voltage and the at least two duty cycle control signals.

18. A duty cycle correction system according to claim 17 wherein the at least two duty cycle control signals comprise a first and a second duty cycle control signal, and wherein the summing circuit comprises:

a first inverter that is responsive to the second duty cycle control signal;

a summer that is responsive to the first reference voltage, the first duty cycle control signal and the first inverter; and a second inverter that is responsive to the summer to produce the second reference voltage.

19. A duty cycle correction system according to claim 15 wherein the second reference voltage is less than the first reference voltage when the duty cycle of the clock signal is less than a predetermined duty cycle, and is greater than the first reference voltage when the duty cycle of the clock signal is greater than the predetermined duty cycle.

20. A duty cycle correction system according to claim 16:

wherein the at least two duty cycle control signals comprise a first and a second duty cycle control signal;

wherein the first duty cycle control signal is greater than the second duty cycle control signal when the duty cycle of the clock signal exceeds a predetermined duty cycle; and wherein the first duty cycle control signal is less than the second duty cycle control signal when the duty cycle of the clock signal is less than the predetermined duty cycle.

21. A duty cycle correction system comprising:

a plurality of pads;

a delay locked loop that is responsive to a clock signal that is received from at least a first one of the plurality of pads, to generate a duty cycle-corrected clock signal from the clock signal, and to generate at least one duty cycle control signal that is based upon a duty cycle deviation between the duty cycle-corrected clock signal and the clock signal;

a first reference voltage generator that generates a first reference voltage;

a second reference voltage generator that generates a second reference voltage from the first reference voltage and from the at least one duty cycle control signal; and a data receiver that compares input data that is received from at least a second one of the plurality of pads to the second reference voltage, in response to the duty cycle-corrected clock signal, to thereby generate duty cycle-corrected output data.

22. A duty cycle correction system according to claim 21 wherein the at least one duty cycle control signal comprises at least two duty cycle control signals that are proportional to the duty cycle deviation between the duty cycle-corrected clock signal and the clock signal.

23. A duty cycle correction system according to claim 22 wherein the second reference voltage generator comprises a summing circuit that sums the first reference voltage and the at least two duty cycle control signals.

24. A duty cycle correction system according to claim 23 wherein the at least two duty cycle control signals comprise a first and a second duty cycle control signal, and wherein the summing circuit comprises:

a first inverter that is responsive to the second duty cycle control signal;

a summer that is responsive to the first reference voltage, the first duty cycle control signal and the first inverter; and a second inverter that is responsive to the summer to produce the second reference voltage.

25. A duty cycle correction system according to claim 21 further comprising an integrated circuit substrate, wherein the plurality of pads, the delay locked loop, the first reference voltage generator, the second reference voltage generator and the data receiver are all included in the integrated circuit substrate.

26. A duty cycle correction system according to claim 25 wherein the integrated circuit substrate is a Rambus memory integrated circuit substrate.

27. A duty cycle correction method comprising the steps of:

generating a duty cycle-corrected clock signal from a clock signal;

generating a reference signal that is based upon a duty cycle deviation between the duty cycle-corrected clock signal and the clock signal; and comparing input data to the reference signal, in response to the duty cycle-corrected clock signal, to thereby generate duty cycle-corrected output data.

28. A duty cycle correction method according to claim 27 wherein the step of generating a reference signal comprises the steps of:

generating at least one duty cycle control signal that is based upon the duty cycle deviation between the duty cycle-corrected clock signal and the clock signal; and generating a second reference voltage from a first reference voltage and from the at least one duty cycle control signal;

the comparing step comprising the step of comparing input data to the second reference voltage, in response to the duty cycle-corrected clock signal, to thereby generate the duty cycle-corrected output data.

29. A duty cycle correction method according to claim 28 wherein the at least one duty cycle control signal comprises at least two duty cycle control signals that are proportional to the duty cycle deviation between the duty cycle-corrected clock signal and the clock signal.

30. A duty cycle correction method according to claim 29 wherein the at least two duty cycle control signals comprise a first and a second duty cycle control signal, and wherein the step of generating a second reference voltage comprises the steps of:

inverting the second duty cycle control signal;

summing the first reference voltage, the first duty cycle control signal and the inverted second duty cycle control signal to produce a summed signal; and inverting the summed signal to produce the second reference voltage.

* * * * *